(12) United States Patent
Li

(10) Patent No.: US 7,667,539 B2
(45) Date of Patent: Feb. 23, 2010

(54) LOW-VOLTAGE WIDE-RANGE LINEAR TRANSCONDUCTOR CELL

(75) Inventor: Shengyuan Li, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 45 days.

(21) Appl. No.: 12/017,055

(22) Filed: Jan. 21, 2008

(65) Prior Publication Data
US 2009/0184766 A1 Jul. 23, 2009

(51) Int. Cl.
*H03F 3/45* (2006.01)
(52) U.S. Cl. .................................. 330/252; 330/283
(58) Field of Classification Search ................ 330/252, 330/254, 283; 333/14
See application file for complete search history.

(56) References Cited

U.S. PATENT DOCUMENTS 6,628,167 B1 * 9/2003 Morton et al. .............. 330/252
6,630,864 B2 * 10/2003 Yang .......................... 330/254

OTHER PUBLICATIONS

"A 3.2-GHz Second-Order Delta-Sigma Modulator Implemented in InP HBT Technology," IEEE Journal of Solid-State Circuits, vol. 30, No. 10, Oct. 1995, pp. 119-1127 (J.F. Jensen, G. Raghavan, A.E. Cosand and R.H. Walden).

"Precision Differential Voltage-Current Convertor," Electronic Letters, vol. 9, No. 6, Mar. 1973, pp. 147-148 (Raimondo Caprio).

* cited by examiner

*Primary Examiner*—Robert Pascal
*Assistant Examiner*—Hieu P Nguyen
(74) *Attorney, Agent, or Firm*—John J. Patti; Wade J. Brady, III; Frederick J. Telecky, Jr.

(57) ABSTRACT

An improved low-voltage, low-power, wide range, and linear Gm Cell is disclosed. In one embodiment, a method of linearizing output current with an input voltage using a Gm Cell includes receiving an input differential voltage by an emitter degenerated input stage and outputting a current including a linear part and a nonlinear part at signal output terminals Iout_P and Iout_M, converting the non-linear part of the output current to a voltage difference via a compression stage, converting the voltage difference to a linear output current by a linear voltage to current converter stage, outputting the linear output current using a current mirror output stage to the signal output terminals Iout_P and Iout_M, and summing the output currents of the emitter degenerated input stage and the current mirror output stage at the signal output terminals Iout_P and Iout_M to obtain a linear output current with the input differential voltage.

11 Claims, 4 Drawing Sheets

LOW-VOLTAGE WIDE-RANGE LINEAR TRANSCONDUCTOR CELL

TECHNICAL FIELD

The present invention relates generally to integrated circuits, and more particularly, relates to transconductor devices.

BACKGROUND

Transconductance is often an important measure of performance parameters including, but not limited to, bandwidth, gain, and noise. Transconductance is an expression of the performance of certain electronic circuits, and traditionally refers to the ratio of output current to input voltage of a particular circuit, or mutual conductance. The term "transconductance" refers to herein as the control of an output current as a result of an input voltage.

In integrated circuits, it may be important for the transconductance, also generally referred to as Gm, of an electronic circuit to remain constant over one or more operating parameters as well as processing variations. The stability or robustness of transconductance of transistors may be an important design parameter, as it may be affected by many operation and processing conditions, such as temperature, carrier mobility, supply voltage, etc.

Transconductors, also generally referred to as Gm Cells, are typically important building blocks in any circuit design. Generally, transconductors are widely used in applications, such as Gm-C filters, Sigma-delta modulators, multipliers and so on. Also generally, in these applications, transconductors are key components that can limit a required dynamic range.

One conventional solution, i.e., a Gm Cell having the most wide linear operating range is shown in FIG. 1. The Gm Cell 100 shown in FIG. 1 includes an emitter degenerated input stage 110, a compression stage 120, a Caprio circuit 130, an emitter follower stage 140, and a current biasing circuit 150. It can be seen in FIG. 1, that the biasing current IB taken from a proportion to absolute temperature (PTAT) current reference to stabilize the Gm of the Bipolar Junction Transistors (BJTs). Further as shown in FIG. 1, VB is taken from source voltage reference that is capable of outputting stable current. Also as shown in FIG. 1, the supply voltage AVDD is connected to some internal regulated stable voltage source for improved power supply rejection (PSR) performance.

However, it can be seen that the Gm Cell 100 shown in FIG. 1, can require a supply voltage of nearly 3V in order to keep every transistor in a linear voltage. This is because VB is at least 3*Vbe+Vce, sat, which is around 2.4 V. For example, if loading circuitry needs 0.6V to stay in a high impedance mode, then the supply voltage required can be 3V, which does not include the extra room that is required for an output swing. Therefore, it can be seen that the Gm Cell 100 shown in FIG. 1 can require a supply voltage of at least 3V and this can be difficult to provide as the supply voltages shrink.

SUMMARY

A low-voltage, low-power, wide range, and linear transconductor cell is disclosed. According to an aspect of the subject matter, the Gm Cell includes an emitter degenerated input stage, a compression stage, a Caprio current, a current biasing circuit, and a current mirror output stage. The emitter degenerated input stage is formed by transistors and resistors, receives an input differential voltage from signal input terminals by the emitter degenerated input stage and outputs a current including a linear part and a nonlinear part at signal output terminals.

The compression stage formed by transistors that converts the non-linear part of the output current received from the emitter degenerated input stage to a voltage difference between emitters of transistors. Then, the Caprio circuit formed by transistors converts the voltage difference between the emitters of transistors to a linear output current. The current mirror output stage formed by transistors outputs the linear output current to the signal output terminals I out_P and Iout_M. In some embodiments, the linear output current through transistors Q5 and Q8 is mirrored out by transistors. Further, the output currents of the emitter degenerated input stage and the Caprio circuit are summed at the signal output terminals Iout_P and Iout_M to obtain a linear output current with the input differential voltage. Typically, the transistors are of the same type of transistors. In addition, the transistors are CMOS transistors and/or bipolar transistors.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
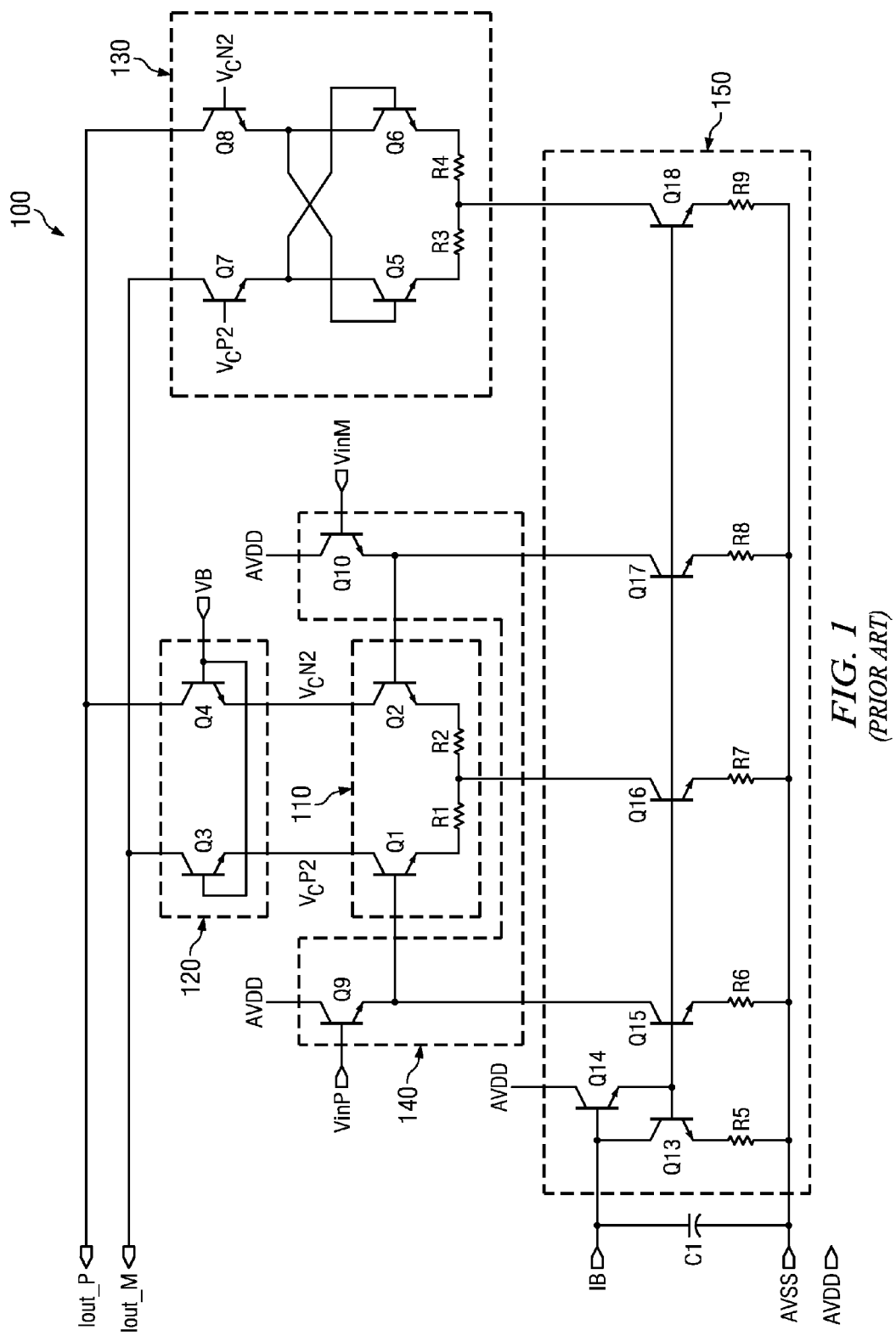
FIG. 1 illustrates a circuit diagram of a conventional Gm Cell.

Refer now to the drawings wherein depicted elements are, for the sake of clarity, not necessarily shown to scale and wherein like or similar elements are designed by the same reference numeral through the several views.

The terms "transconductance" and "Gm" are used interchangeably throughout the document. Further, the terms "transconductor cell" and "Gm Cell" are used interchangeably throughout the document.

FIG. 1 illustrates a circuit diagram of a conventional Gm Cell 100. Particularly, FIG. 1 illustrates an emitter degenerated input stage 110, a compression stage 120, a Caprio circuit 130, an emitter follower stage 140, and a current biasing circuit 150.

As shown in FIG. 1, the emitter degenerated input stage 110 is formed by transistors Q1, Q2 and resistors R1, R2, wherein R1=R2 and R1 and R2 can be selected, for example, such that R1=R2=1/(2*Gm), wherein Gm is the desired transconductance. Further, the compression stage 120 is formed by transistors Q3 and Q4. The compression stage 120 converts a nonlinear part of a current from the emitter degenerated input stage 110 into a voltage difference between the emitters of transistors Q3 and Q4.

The Caprio circuit 130 is formed by transistor Q5, Q6, Q7, Q8 and resistors R3 and R4, where R3=R4=R1=R2. The Caprio circuit 130 converts the voltage difference between the emitters of transistors Q3 and Q4 to a linear current that is superimposed on the emitter degenerated input stage 110, resulting in a linear output current over very wide range for the Gm Cell 100.

The emitter follower stage 140 is formed by transistors Q9 and Q10. The emitter follower stage shifts an input voltage at the same output voltage level for cascading connections. The current biasing circuit 150 is formed by transistors Q13, Q14, Q15, Q16, Q17, Q18 and resistors R5, R6, R7, R8, R9. As shown in FIG. 1, the Gm Cell 100 includes a capacitor C1 for bypassing.

As shown in FIG. 1, a biasing current IB is taken from a PTAT current reference to stabilize the transconductance (Gm) of Bipolar Junction Transistors (BJTs). Further as shown in FIG. 1, VB is taken from source voltage reference that is capable of outputting stable current. Also as shown in FIG. 1, the supply voltage AVDD is connected to some internal regulated stable voltage source for improved power supply rejection (PSR) performance.

In operation, the Gm Cell 100 requires a supply voltage of at least 3V in order to keep all transistors in a linear region. The voltage VB coupled to the compression stage 120 requires at least $3*+V_{be}+Vce,sat$ volts, which is around 2.4V. For example, if the loading circuitry needs 0.6V to stay in high-Z (Impedance) mode, then the supply voltage requires 3V, which does not include the extra room that is required for an output swing. Therefore, it can be seen that the Gm cell 100 shown in FIG. 1 can require a supply voltage of at least 3V and this can be difficult to provide as the supply voltages shrink.

Figure 2:
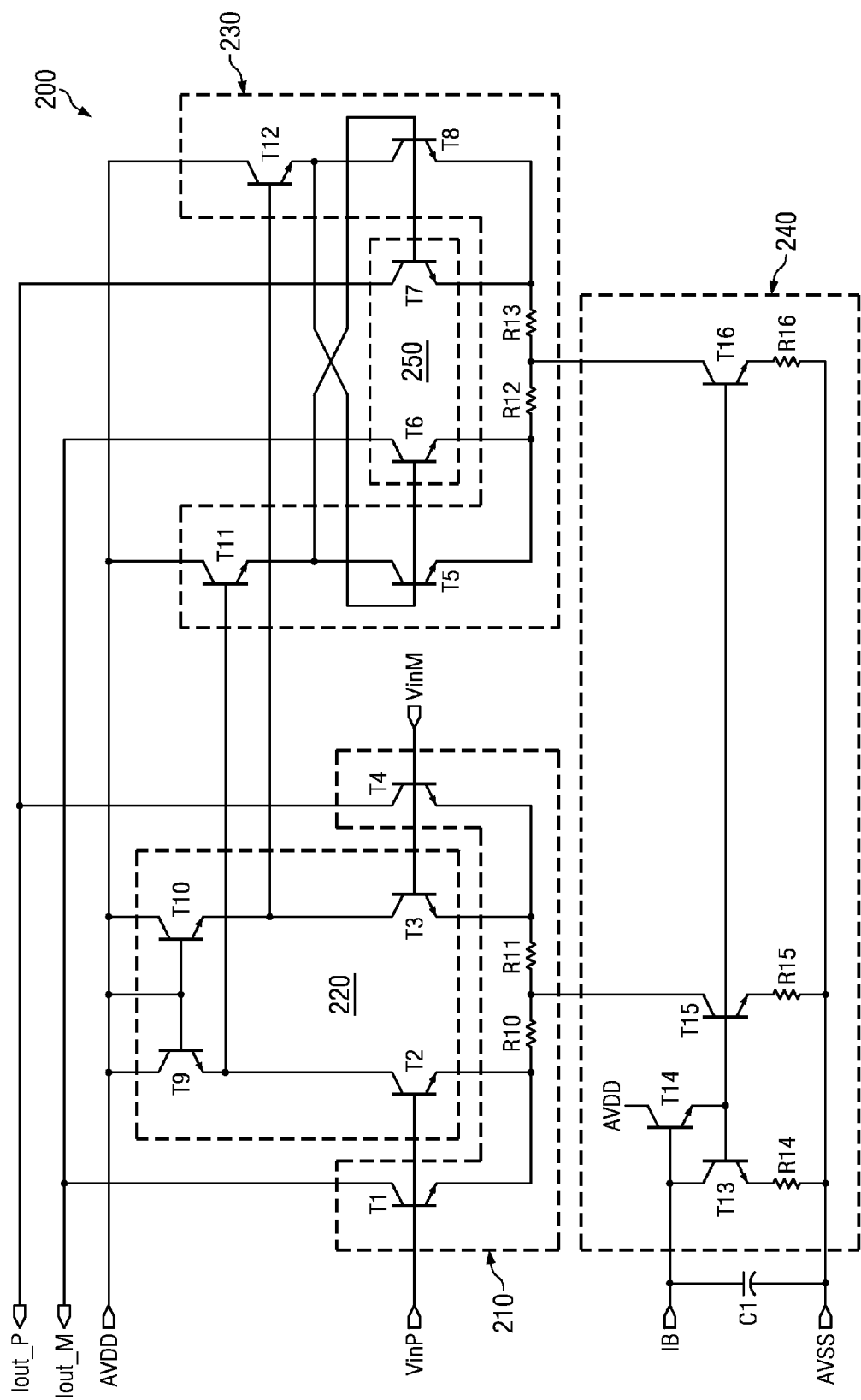
FIG. 2 is a circuit diagram of a Gm Cell in accordance with a preferred embodiment of the present invention.

FIG. 2 is a circuit diagram of a Gm Cell 200 in accordance with a preferred embodiment of the present invention. Particularly, FIG. 2 illustrates an emitter degenerated input stage 210, a compression stage 220, a Caprio circuit 230, a current biasing circuit 240, and a current mirror output stage 250. The Caprio circuit 230 shown in FIG. 2 is an example of a linear voltage to current converter stage.

As shown in FIG. 2, the Gm Cell 200 includes the emitter degenerated input stage 210 coupled to signal input terminals VinP and VinM and signal output terminals Iout_P and Iout_M. The emitter degenerated input stage 210 includes transistors T1 and T4. The emitter degenerated input stage 210 also includes resistors R1 and resistor R2 having substantially equal resistance values. For example, let the emitter area of T2 (AE2) is one-fourth of the emitter area of T1 (AE1). For an input degeneration resistance of 10 KOhms, the correct degeneration resistance for T2 is 40 KOhms, i.e., 10 KOhm in parallel with 40 KOhms (10 KOhm//40 KOhms) results in an equivalent total resistance of R1=R2=40K//10K=8 KOhms. Therefore, by using one 8 KOhms resistor instead of one 10 KOhm and one 40 KOhm resistor eliminates the matching concern and saves area.

Further as shown in FIG. 2, the Gm Cell 200 includes the Caprio circuit 230 coupled to a supply voltage terminal AVDD. The Caprio circuit 230 includes transistors T5, T8, T11, and a T12, and resistors R3 and R4. Typically, the resistors R1, R2, R3 and R4 have substantially equal resistance values.

The Gm Cell 200 also includes the compression stage 220 coupled to the supply voltage terminal AVDD, the signal input terminals VinP and VinM, and the Caprio circuit 230. The compression stage 220 includes transistors T2, T3, T9 and T10.

Further, the Gm Cell 200 includes the current biasing circuit 240 coupled to the emitter degenerated input stage 210, the Caprio circuit 230, a supply voltage terminal AVSS and a current input terminal IB. The current biasing circuit 240 includes transistor T14. Also, the current biasing circuit 240 includes transistor T13, T15, and T16 and associated resistors R5, R6, and R7, respectively.

In addition, the Gm Cell 200 includes the current mirror output stage 250 coupled to the signal output terminals Iout_P and Iout_M. The current mirror output stage 250 includes transistors T6 and T7.

A shown in FIG. 2, the current biasing circuit 240 further includes a capacitor C1 having an input and an output. The input of the capacitor C1 is coupled to the current input terminal IB and the output of the capacitor C1 is coupled to the supply voltage terminals AVSS. Transistor T14 includes a collector, an emitter and a base, in which the base of transistor T14 is coupled to the current input terminal IB, and the collector of transistor T14 is coupled to the supply voltage terminal AVDD.

Further, each of the transistors T13, T15 and T16 includes an associated collector, emitter and base. Typically, the emitter of transistor R14 is coupled to the bases of transistors T13, T15 and T16.

As shown in FIG. 2, each of the resistors R5, R6 and R7 have an associated input and output. Typically, the input of resistor R5 is coupled to the emitter of transistor T13, the input of the resistor R6 is coupled to the emitter of transistor T15, the input of the resistor R7 is coupled to transistor T16 and the outputs of resistors R5, R6, and R7 are coupled to the supply voltage terminal AVSS.

Further, each of transistors T1 and T4 in the emitter degenerated input stage 210 has an associated input electrode, emitter and base, and each of resistor R1 and resistor R2 in the emitter degenerated input stage 210 has an associated input and output. As shown in FIG. 2, the base of transistor T1 is coupled to the signal input terminal VinP, the collector of transistor T1 is coupled to the signal output terminal Iout_M, and the emitter of transistor T1 is coupled to the input of resistor R1. The base of transistor T4 is coupled to the the signal input terminal VinM, the collector of transistor T4 is coupled to the signal output terminal Iout_P, and the emitter of transistor T4 is coupled to the output of resistor R2, and the output resistor R1 is coupled to the input of resistor R2.

Further as shown in FIG. 2, each of transistor T2, T3, T9 and T10 of the compression stage 220 has a collector, a base and a emitter. The collector of the transistor T9 is coupled to the supply voltage terminal AVDD, the base of the transistor T9 is coupled to the base of the transistor T10, the emitter of transistor T9 is coupled to the collector of transistor T2, the emitter of the transistor T2 is coupled to the input of resistor R1, the collector of transistor T10 is coupled to the supply voltage terminal AVDD, the emitter of transistor T10 is coupled to the collector of transistor T3, the emitter of transistor T3 is coupled to the output of resistor R2, the output of resistor R1 is coupled to the input of resistor R2, and the base of transistors T9 and T10 are coupled to the supply voltage terminal AVDD.

Further, as shown in FIG. 2, each of the transistors T5, T6, T7, T8, T11 and T12 has a collector, a base and emitter and each of resistors R3 and R4 has an input and an output. The collector of transistor T11 is coupled to the supply voltage terminal AVDD, the base of transistor T11 is coupled to the output electrode of transistor T9 and the input electrode of transistor T2, the emitter of transistor T11 is coupled the collector of transistor T5, the base of transistor T5 is coupled to the base of transistor T6, the emitter of transistor T5 is coupled to the input of the resistor R3, the collector of transistor T6 is coupled to the signal output terminal Iout_M, and the emitter transistor T5 is coupled to the input of resistor R3.

Further, the collector of transistor T7 is coupled to the signal output terminal Iout_P, the base of transistor T7 is coupled to the base of transistor T8, the emitter of transistor T7 is coupled to the output of transistor R4, the collector of transistor t8 is coupled to the emitter of transistor T12 and the base of transistor T5, the emitter of transistor T8 is coupled to the output of resistor R4, the base of transistor T8 is further coupled to the collector of transistor T5 and the emitter of transistor T11, the collector of transistor T12 is coupled to the supply voltage terminal AVDD, the base of transistor T12 is coupled to the emitter of transistor T10 and the collector of transistor T3, and the output of resistor R3 is coupled to the input of resistor R4.

Typically, transistor T1 through T16 are of the same type of transistors. In addition, transistors T1 through T16 are CMOS transistors and/or bipolar transistors. As shown in FIG. 2, for example, each of transistors T1 through T16 are each NPN transistors.

In operation, an input differential voltage from the signal input terminals VinP and VinM is received by the emitter degenerated input stage 210 and a current including a linear part and a nonlinear part is outputted at the signal output terminals Iout_P and Iout_M. The non-linear part of the output current received from the the emitter degenerated input stage 210 is converted to a voltage difference between the emitters of transistors T9 and T10 by the compression stage 220. Further, the voltage difference between the emitters of transistors T9 and T10 is converted to a linear output current by the Caprio circuit 230.

In operation, the linear output current is outputted using the current mirror output stage 250 to the signal output terminal Iout_P and Iout_M. Finally, the output currents of the emitter degenerated input stage 210 and the Caprio circuit 230 are summed at the signal output terminals Iout_P and Iout_M to obtain a linear output current with the input differential voltage. In these embodiments, the linear output current through transistors T5 and T6 is mirrored out by transistors T6 and T7 and then superimposed on the emitter degenerated input stage 210, resulting in a linear current-voltage (I-V) conversion over very wide range of input voltage for the Gm Cell 200. In some embodiments, the emitter areas of transistors T1 ($A_{E1}$), T2 ($A_{E2}$), T3 ($A_{E3}$), T4 ($A_{E4}$), T5 ($A_{E5}$), T6 ($A_{E6}$), T7 ($A_{E7}$), and T8 ($E_{E8}$) are sized such that $A_{E1}/A_{E2}=A_{E4}/A_{E3}=A_{E6}/A_{E5}=A_{E7}/A_{E8}$. In some embodiments, transistor T9 and T10 are of the same type. Further, transistors T9 and T10 are CMOS transistors and/or bipolar transistors.

In accordance with the above described procedure, the Gm Cell 200 requires a supply voltage AVDD of about $3*V_{be}+V_{ce}$,sat, which is around 2.4V. In one embodiment, the input is directly biased at the same voltage level (AVDD) as the output voltage (e.g., VDD/2=2.4/2=1.2), thus getting rid of the input emitter follower. Hence, the Gm Cell 200 operates at a lower voltage.

In accordance with the above described embodiments, the Gm Cell 100 and the Gm Cell 200 are simulated with the same total biasing current (100 µA) for the same transconductance (50 µS). For example, for Gm Cell 100, the VB is biased at 2.5V and the supply voltage is 4V, whereas for the Gm Cell 200 (S-cell), the supply voltage is 2.4V.

Figure 3:
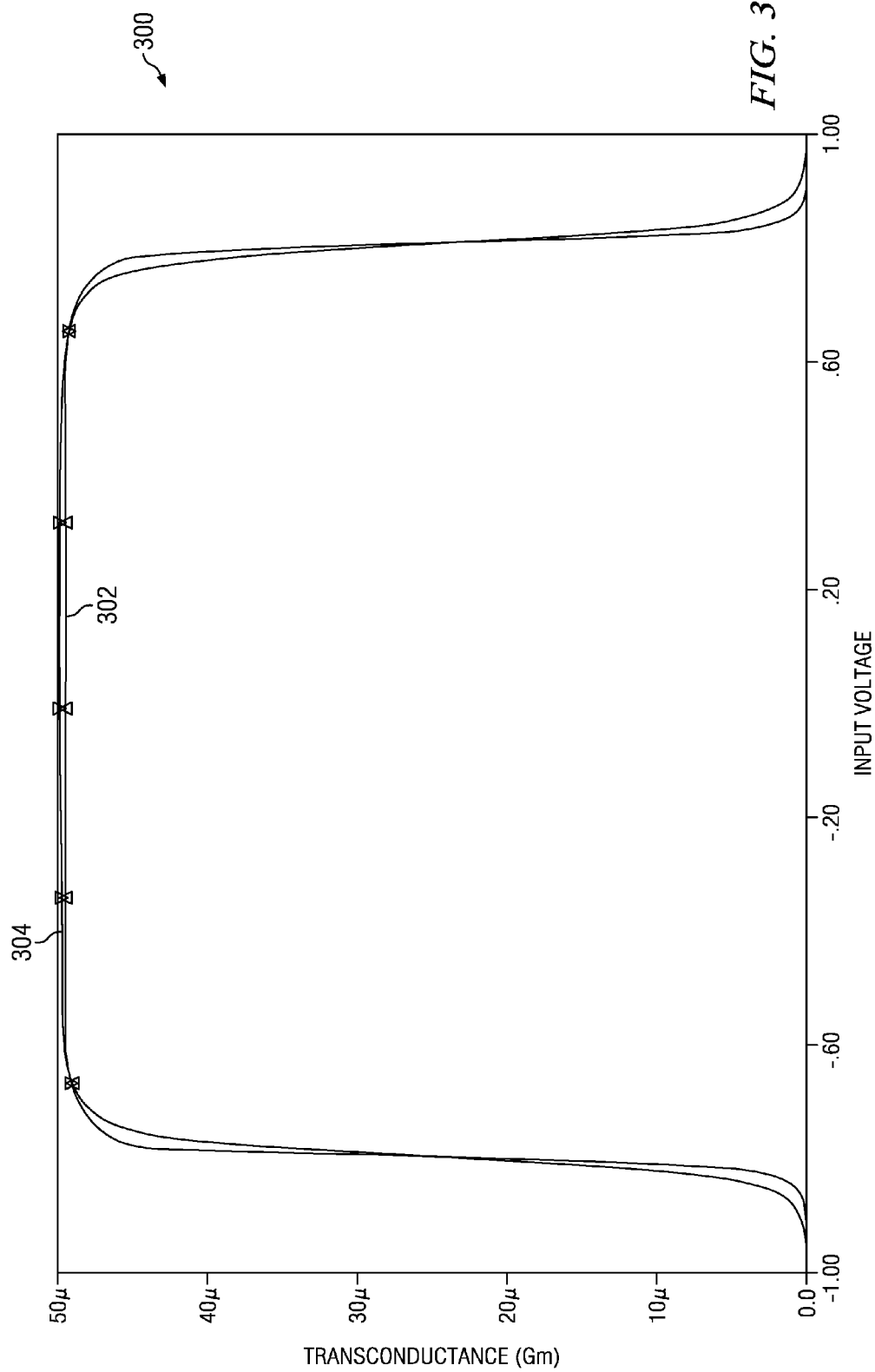
FIG. 3 is a graph illustrating Gm versus the differential input voltage obtained during the operation of the Gm Cells shown in FIGS. 1 and 2.

FIG. 3 is a graph 300 illustrating transconductance (Gm) versus the differential input voltage obtained during the operation of the Gm cells 100 and 200 shown in FIGS. 1 and 2 respectively, according to an embodiment of the present invention. As shown in FIG. 3, curve 302 represents the Gm versus the differential input voltage for the Gm Cell 100 and curve 304 represents the Gm versus the differential input voltage for the Gm Cell 200. It is apparent that, the Gm Cell 200 maintains linearity over a wide range (1.2 VPP) as illustrated by the curve 304 when compared to the curve 302.

Figure 4:
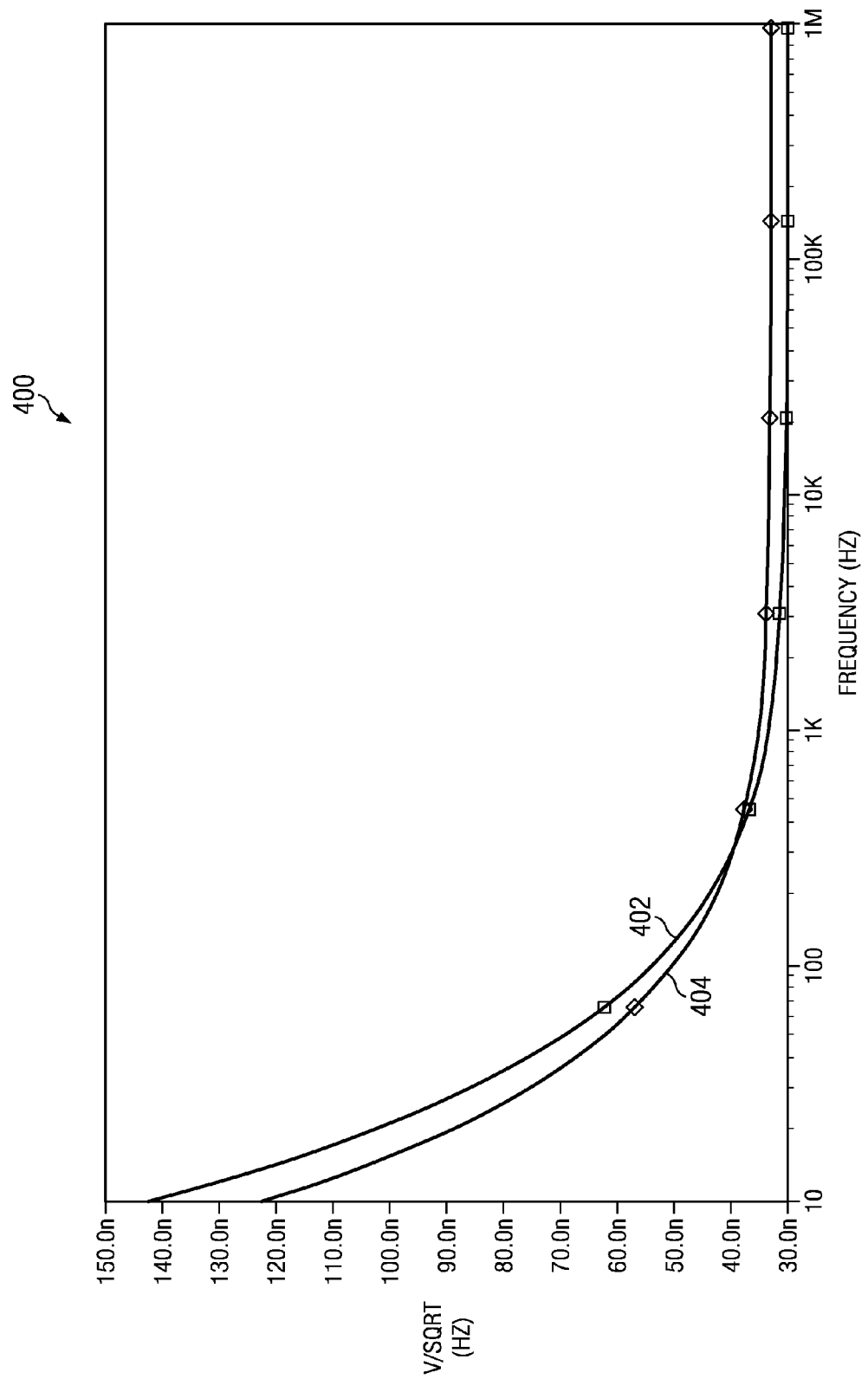
FIG. 4 is a graph showing noise performance comparison of the Gm Cells shown in FIGS. 1 and 2.

FIG. 4 is a graph 400 showing noise performance comparison of the Gm Cells 100 and 200 shown in FIGS. 1 and 2, according to an embodiment. As shown in FIG. 4, a response curve 402 represents the noise performance for the Gm Cell 100 and a response curve 404 represents the noise performance for the Gm Cell 200. It can be apparent that, the Gm Cell 200 has a comparable noise performance when compared to the Gm Cell 100 as shown in FIG. 4.

In summary, the following observations can be made:
1) The GM Cell 200 successfully maintains the linearity over the wide-range (1.2 VPP) as shown in FIG. 3.
2) The Gm Cell 200 has a comparable noise performance to the Gm Cell 100.

Therefore, it can be concluded that, the Gm Cell 200 maintains the dynamic range performance of the Gm Cell 100 while reducing the supply voltage from 4V to 2.4V. Thus, the GM cell 200 leads to about 40% power saving. Further, it can be seen that the above Gm Cell 200 do not require the input emitter follower, shown in FIG. 1, as the input voltage can be directly biased at the same voltage as the output voltage, for example, VDD/2=2.4/2=1.2V.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. An apparatus comprising:
an emitter degenerated input stage coupled to a first signal input terminal, a second signal input terminal, a first signal output terminal, and a second signal output terminal, wherein the the emitter degenerated input stage includes a first resistor, a second transistor, a first resistor, and a second resistor;
a Caprio circuit coupled to a first supply voltage terminal, wherein the Caprio circuit includes a third transistor, a fourth transistor, a fifth transistor, a sixth transistor, a third resistor, and a fourth resistor, wherein the first, second, third, and fourth resistors have substantially equal resistance values;
a compression stage coupled to the first supply voltage terminal, the signal input terminals, and the Caprio circuit, wherein the compression stage includes a seventh transistor, an eighth transistor, a ninth transistor, and a tenth transistor; and
a current biasing circuit coupled to the emitter degenerated input stage and the Caprio circuit, wherein the current biasing circuit includes:
a capacitor that is coupled between a second supply voltage terminal and a current input terminal;

an eleventh transistor having a first electrode, a second electrode, and a control electrode, wherein the control electrode of the eleventh transistor is coupled to the current input terminal, and wherein the first electrode of the eleventh transistor is coupled to the first supply voltage terminal.

2. The apparatus of claim 1, wherein the current biasing circuit further comprises:
   a twelfth transistor having a first electrode, a second electrode and a control electrode; wherein the first electrode of the twelfth transistor is coupled to the current input terminal, and wherein the control electrode of the twelfth transistor is coupled to the second electrode of the eleventh transistor;
   a thirteenth transistor having a first electrode, a second electrode, and a control electrode, wherein the control electrode of the thirteenth transistor is coupled to the second electrode of the eleventh transistor; and
   a fourteenth transistor having a first electrode, a second electrode and a control electrode, wherein the control electrode of the fourteenth transistor is coupled to the second electrode of the eleventh transistor.

3. The apparatus of claim 2, wherein the current biasing circuit further comprises:
   a first resistor coupled between the second electrode of the second transistor and the second supply voltage terminal;
   a second resistor coupled between the second electrode of the third transistor and the second supply voltage terminal; and
   a third resistor is coupled between the second electrode of the fourth transistor and the second supply voltage terminal.

4. The apparatus of claim 3, wherein the emitter degenerated input stage further comprises:
   the first transistor having a first electrode, a second electrode, and a control electrode, wherein the first electrode of the first transistor is coupled to the first signal output terminal, and wherein the control electrode of the first transistor is coupled to the first signal input terminal;
   the second transistor having a first electrode, a second electrode, and a control electrode, wherein the first electrode of the second transistor is coupled to the second signal output terminal, and wherein the control electrode of the second transistor is coupled to the second signal input terminal;
   the first resistor is coupled to the second control electrode of the first transistor and the first electrode of the thirteenth transistor; and
   the second resistor is coupled to the second control electrode of the second transistor and the first electrode of the thirteenth transistor.

5. The apparatus of claim 4, wherein the compression stage further comprises:
   the seventh transistor having a first electrode, a second electrode, and a control electrode, wherein the control electrode of the seventh transistor is coupled to the first signal input terminal, and wherein the second electrode of the seventh transistor is coupled to the second electrode of the first transistor;
   the eighth transistor having a first electrode, a second electrode, and a control electrode, wherein the control electrode is coupled to the second signal input terminal, and wherein the second electrode of the eighth transistor is coupled to the second electrode of the second transistor;
   the ninth transistor having a first electrode, a second electrode, and a control electrode, wherein the control electrode and the first electrode of the ninth transistor are coupled to the first supply voltage terminal, and wherein the second electrode of the ninth transistor is coupled to the first electrode of the seventh transistor; and
   the tenth transistor having a first electrode, a second electrode, and a control electrode, wherein the control electrode and the first electrode of the tenth transistor are coupled to the first supply voltage terminal, and wherein the second electrode of the tenth transistor is coupled to the first electrode of the eighth transistor.

6. An apparatus comprising:
   an emitter degenerated input stage coupled to a first signal input terminal, a second signal input terminal, a first signal output terminal, and a second signal output terminal;
   a Caprio circuit coupled to a first supply voltage terminal;
   a current mirror output stage coupled between the Caprio circuit and each of the first and second signal output terminals;
   a compression stage coupled to the first supply voltage terminal, the signal input terminals, and the Caprio circuit; and
   a current biasing circuit coupled to the emitter degenerated input stage and the Caprio circuit, wherein the current biasing circuit includes:
      a capacitor that is coupled to between a second supply voltage terminal and a current input terminal;
      a transistor having a first electrode, a second electrode, and a control electrode, wherein the control electrode is coupled to the current input terminal, and wherein the first electrode is coupled to the first supply voltage terminal.

7. The apparatus of claim 6, wherein the emitter degenerated input stage further comprises:
   a first NPN transistor that is coupled to the first signal output terminal at its collector and that is coupled to the first signal input terminal at its base;
   a second NPN transistor that is coupled the that is coupled the second signal output terminal at its collector and that is coupled to the second signal input terminal at its base;
   a plurality of resistors coupled between the emitters of the first and second NPN transistors.

8. The apparatus of claim 6, wherein the transistor further comprises a first NPN transistor with its base coupled to the current input terminal and its collector coupled to the first voltage supply terminal, and wherein the current biasing circuit further comprises:
   a capacitor coupled between the current input terminal and the second supply voltage terminal;
   a second NPN transistor that is coupled to the current input terminal at its collector and that is coupled to the emitter of the first NPN transistor at its base;
   a third NPN transistor that is coupled to the emitter degenerated input stage at its collector and that is coupled to the emitter of the first NPN transistor at its base;
   a fourth NPN transistor that is coupled to the Caprio circuit at its collector and that is coupled to the emitter of the first NPN transistor at its base; and
   a plurality of resistors, wherein each resistor is coupled between the second supply voltage terminal and the emitter of at least one of the second, third, and fourth NPN transistors.

9. The apparatus of claim 6, wherein the Caprio circuit further comprises:
   a first NPN transistor that is coupled to the first supply voltage terminal at its collector and the compression stage at its base;

a second NPN transistor that is coupled to the first supply voltage terminal at its collector and the compression stage at its base;

a third NPN transistor that is coupled to the emitter of the first NPN transistor at its collector and that is coupled to the emitter of the second NPN transistor at its base;

a fourth NPN transistor that is coupled to the emitter of the second NPN transistor at its collector and that is coupled to the emitter of the first NPN transistor at its base; and a plurality of resistor coupled between the emitter of the third and fourth NPN transistors.

10. The apparatus of claim 9, wherein the current mirror output stage further comprises:

a fifth NPN transistor that is coupled to the first output terminal at its collector, the emitter of the second NPN transistor at its base, and the emitter of the third NPN transistor at its emitter; and a sixth NPN transistor that is coupled to the second output terminal at its collector, the emitter of the first NPN transistor at its base, and the emitter of the fourth NPN transistor at its emitter.

11. The apparatus of claim 6, wherein the compression stage further comprises:

a first NPN transistor that is coupled to the first supply voltage terminal at its collector and its base;

a second NPN transistor that is coupled to the first supply voltage terminal at its collector and its base;

a third NPN transistor that is coupled to the first signal input terminal at its base, the emitter of the first NPN transistor at its collector, and the emitter degenerated input stage at its emitter; and a fourth NPN transistor that is coupled to the second signal input terminal at its base, the emitter of the second NPN transistor at its collector, and the emitter degenerated input stage and its emitter.

* * * * *